United States Patent
Zhou et al.

(10) Patent No.: US 9,343,206 B2
(45) Date of Patent: May 17, 2016

(54) ELECTRICALLY-DRIVEN PHASE TRANSITIONS IN FUNCTIONAL OXIDE HETEROSTRUCTURES

(71) Applicants: You Zhou, Cambridge, MA (US); Zheng Yang, Chicago, IL (US); Shriram Ramanathan, Acton, MA (US)

(72) Inventors: You Zhou, Cambridge, MA (US); Zheng Yang, Chicago, IL (US); Shriram Ramanathan, Acton, MA (US)

(73) Assignee: PRESIDENT AND FELLOWS OF HARVARD COLLEGE, Cambridge, MA (US)

( * ) Notice: Subject to any disclaimer, the term of this patent is extended or adjusted under 35 U.S.C. 154(b) by 64 days.

(21) Appl. No.: 14/373,908

(22) PCT Filed: Feb. 6, 2013

(86) PCT No.: PCT/US2013/024866
§ 371 (c)(1),
(2) Date: Jul. 23, 2014

(87) PCT Pub. No.: WO2013/119617
PCT Pub. Date: Aug. 15, 2013

(65) Prior Publication Data
US 2014/0375417 A1 Dec. 25, 2014

Related U.S. Application Data

(60) Provisional application No. 61/595,668, filed on Feb. 6, 2012.

(51) Int. Cl.
*H01C 7/10* (2006.01)
*G11C 11/56* (2006.01)
*G11C 13/00* (2006.01)
(Continued)

(52) U.S. Cl.
CPC .............. *H01C 7/10* (2013.01); *G11C 11/5678* (2013.01); *G11C 13/0004* (2013.01); *H01C 7/18* (2013.01); *H01C 17/06* (2013.01); *H01L 45/04* (2013.01); *H01L 45/12* (2013.01); *H01L 45/1233* (2013.01); *H01L 45/146* (2013.01); *H01L 45/147* (2013.01)

(58) Field of Classification Search
None
See application file for complete search history.

(56) References Cited

U.S. PATENT DOCUMENTS

| 6,236,059 | B1 | 5/2001 | Wolstenholme et al. |
| 7,863,113 | B2 | 1/2011 | Roca I Cabarrocas et al. |

(Continued)

OTHER PUBLICATIONS

Viswanath et al. ("Geometric confinement effects on the metal-insulator transition temperature and stress relaxation in VO2 thin films grown on silicon", Journal of Applied Physics 109, 063512, 2011).*

(Continued)

*Primary Examiner* — Yasser A Abdelaziez
(74) *Attorney, Agent, or Firm* — Elizabeth Kim Patent Law Offices LLC (57) ABSTRACT

A tunable resistance system includes a layer of a first functional material deposited on a component of the system. The first functional material undergoes a phase transition at a first critical voltage. An insulating layer is deposited upon the layer of first functional material. A layer of a second functional material deposited on the insulating layer. The second functional material undergoes a phase transition at a second critical voltage. The insulating layer is configured to induce a stress on the layer so as to change the first critical voltage. In this way, the resistance of the system is tunable, allowing the system to undergo multi-stage electrical switching of resistive states.

15 Claims, 6 Drawing Sheets

(51) Int. Cl.
*H01L 45/00* (2006.01)
*H01C 7/18* (2006.01)
*H01C 17/06* (2006.01)

(56) References Cited

U.S. PATENT DOCUMENTS

2004/0140523 A1  7/2004  Hudgens et al.
2010/0084625 A1  4/2010  Wicker et al.
2010/0124805 A1  5/2010  Na et al.

OTHER PUBLICATIONS

International Search Report for PCT/US2013/024866, Jun. 14, 2013, 3 pages, KIPO (Korean Intellectual Property Office), Daejeon, Republic of Korea.

* cited by examiner

ELECTRICALLY-DRIVEN PHASE TRANSITIONS IN FUNCTIONAL OXIDE HETEROSTRUCTURES

CROSS-REFERENCE TO RELATED APPLICATIONS

The present application is based upon, and claims the benefit of priority under 35 U.S.C. §119, to U.S. Provisional Patent Application No. 61/595,668 (the "'668 provisional application"), filed Feb. 6, 2013 and entitled "Multi-Resistance States Through Electrically-Driven Phase Transitions in Functional Oxide Heterostructures." The content of the '668 provisional application is incorporated herein by reference in its entirety as though fully set forth.

BACKGROUND

In a number of materials, including materials that exhibit sharp phase transition characteristics, the electrical control of resistance is of much interest. Applications are numerous, including without limitation solid-state devices such as memory resistance, multi-stage memory, and neural circuits.

Oxides that display sharp phase transitions, such as $VO_2$, are of particular interest in this regard, owing to their ability to manipulate conductance through an external bias at or near room temperature.

BRIEF DESCRIPTION OF THE DRAWINGS

The drawings disclose illustrative embodiments. They do not set forth all embodiments. Other embodiments may be used in addition or instead.

DETAILED DESCRIPTION

Illustrative embodiments are discussed in this application. Other embodiments may be used in addition or instead.

It should be understood that the invention is not limited to the particular embodiments described, as such may vary. Also, the terminology used herein is for the purpose of describing particular embodiments only, and is not intended to be limiting, since the scope of the present invention will be limited only by the appended claims.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

Figure 1:
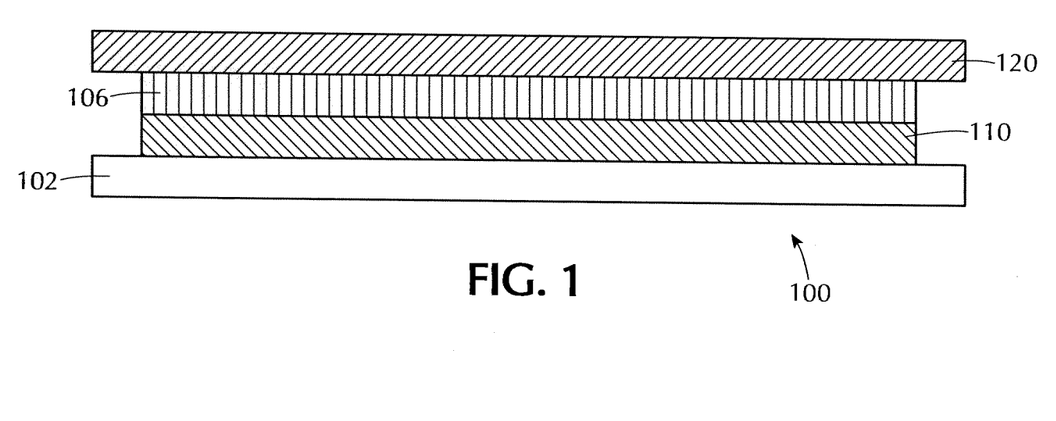
FIG. 1 is a schematic block diagram of a tunable resistance system in accordance with some embodiments of the present disclosure.

FIG. 1 is a schematic block diagram of a tunable resistance device 100 in accordance with some embodiments of the present disclosure. The device 100 includes a layer 110 of a first functional material deposited on a component 102 of the device 100, such as an electrode or an interstitial layer. The first functional material undergoes a phase transition at a first critical voltage.

The device 100 includes an insulating layer 106 deposited upon the layer 110. The device further includes a layer 120 of a second functional material deposited on the insulating layer. The second functional material undergoes a phase transition at a second critical voltage.

The insulating layer 106 is configured to induce a stress on the layer 110, so as to change the first critical voltage. In this way, the resistance of the system is tunable, and the system undergoes multi-stage electrical switching of resistive states.

The first functional material and the second functional material may be identical. In other embodiments, the first and second functional materials may be different.

In some embodiments, the first functional material and/or the second functional material may be an oxide for example, a functional oxide, a metal oxide, or a semiconductor oxide (such as a silicon oxide).

In other embodiments, the first functional material and/or the second functional material may be a nitride, or a rare earth nickelide (such as a samarium nickelide (SmNiO3) by way of example), or a chalcogenide.

In some embodiments, the device 100 may be a $VO_2/H_xO_2/VO_2$ sandwiched structure disposed on a conducting Si substrate.

In some embodiments, a tunable resistance system may include a plurality N of structures 100, stacked adjacent to one other.

In some embodiments, the fabrication of the $VO_2/H_xO_2/VO_2$ structure may include the following steps. A layer of $VO_2$ thin film is first grown on heavily-doped (n+, 2~5 mΩ cm) $S_i$ substrate, using for example radio-frequency magnetron sputtering from a $V_2O_5$ target in $A_r$ environment. The $A_r$ flow rate is 100 sccm, grown on top of the $VO_2$ thin film by atomic layer deposition. A second layer of $VO_2$ is then grown on top of the $H_xO_2$ using the same process as the first $VO_2$ layer.

Examples of thicknesses of each layer may be: 200 nm for the bottom $VO_2$ layer; 10 nm for the $H_xO_2$ layer, and 150 nm for the top $VO_2$ layer. The $H_xO_2$ layer thickness is chosen to be thick enough to cover the surface of bottom $VO_2$, but at the same time not too thick to block the current completely.

Finally, metal contacts (for example, Au(200 nm)/Ti(20 nm)) may be deposited on the surface of the sample with shadow masks using electron-beam evaporation. These metal contacts may be used as top contacts in the current out-of-plane measurement. The electrical characteristics may be measured in both voltage-controlled mode (V-mode) and current-controlled mode (I-mode) with a temperature controllable probe station.

In one illustrative embodiment, the device may be a 500 um×500 um n+-Si/$VO_2/H_xO_2/VO_2$ heterostructure device.

Figure 2A:
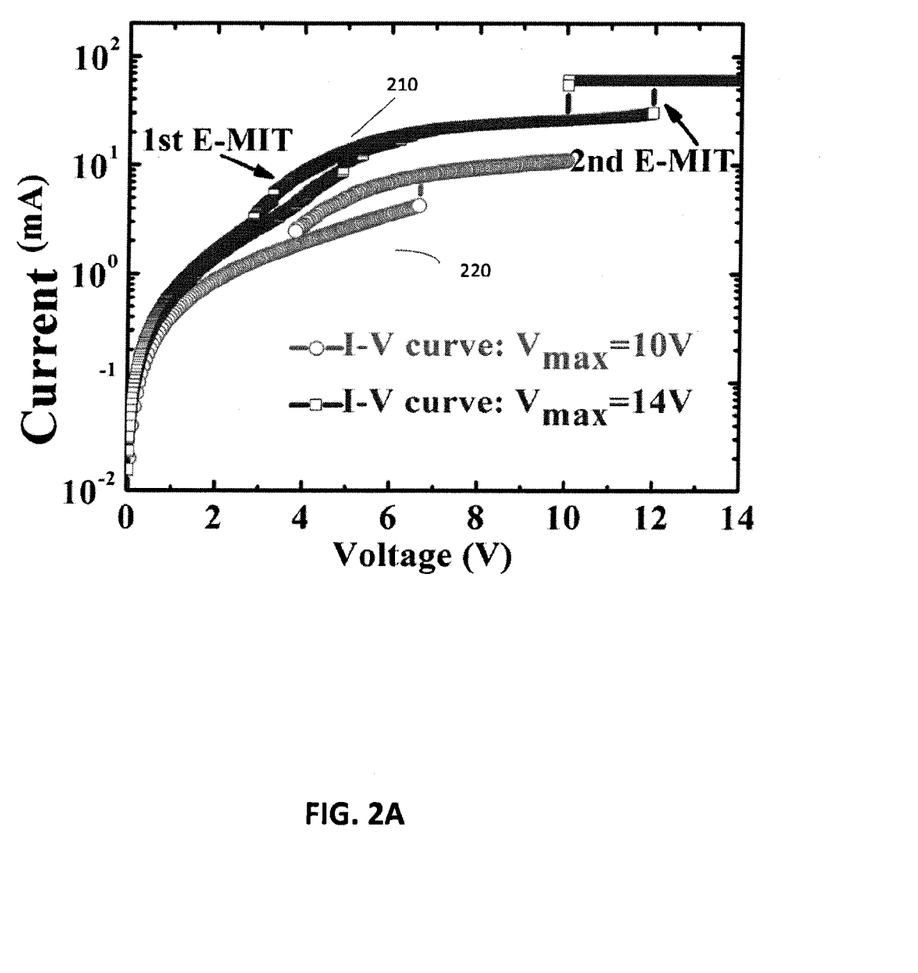
FIG. 2A shows out-of-plane current-voltage (IV) characteristics of a $VO_2/H_xO_2/VO_2$ heterostructure device that has a tunable resistance with two distinct electrically-driven metal-insulator transitions.

FIG. 2A shows an out-of-plane current-voltage (IV) characteristics of a $VO_2/H_xO_2/VO_2$ heterostructure device, measured in V-mode. The device has a tunable resistance, with two distinct electrically-driven metal-insulator transition, and its pristine resistance value is about 14 kΩ. When sweeping the voltage to 10V, the resistance decreases due to formation of metallic nuclei, which is caused by the large current passing through.

After a few cycles, the IV curve becomes stable, as shown in the curve labeled 220 in FIG. 2A and its small signal resistance decreases to 2.4 kΩ. The abrupt current jump at around 6V displays the electrically driven metal-insulator transition (E-MIT) of a single $VO_2$ layer. Both sharp and gradual transitions can be observed in single $VO_2$ layer but they only show one hysteresis loop.

After reproducible measurements for over 30 cycles, the curve labeled 210 in FIG. 2A was obtained with a larger maximum voltage ($V_{max}$=14V). It shows two distinct hysteresis loops, which are brought out by the phase transitions in the two $VO_2$ layers at different electric field values. A second 'forming' happens: the resistance decreases to 1.8 kΩ. Also E-MIT in curve 210 now happens at a smaller threshold voltage ($V_{th}$) due to formation of metallic nuclei.

Such phenomena may be similar to electroforming in other oxides, but it is not necessary to observe the E-MIT as shown later. After the second transition, the IV curve becomes flat because it has reached the current limit. In some embodiments, both curves may be measured a few dozen times, to verify the reproducibility of E-MITs. No degradation was shown, whereas there is a variation in $V_{th}$.

Figure 2B:
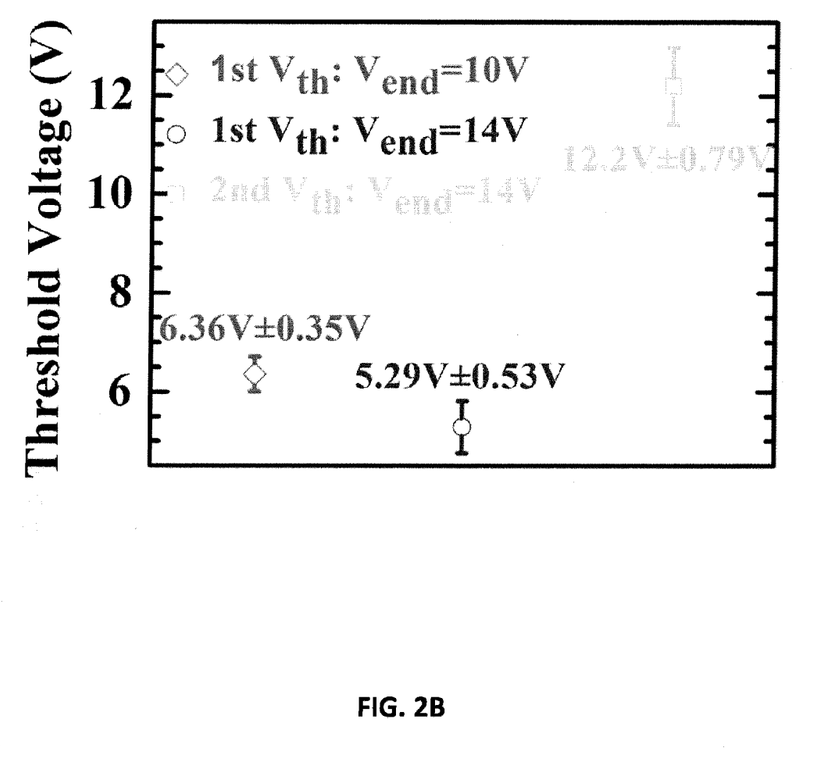
FIG. 2B shows an average of threshold voltages with standard deviation.
Figure 2C:
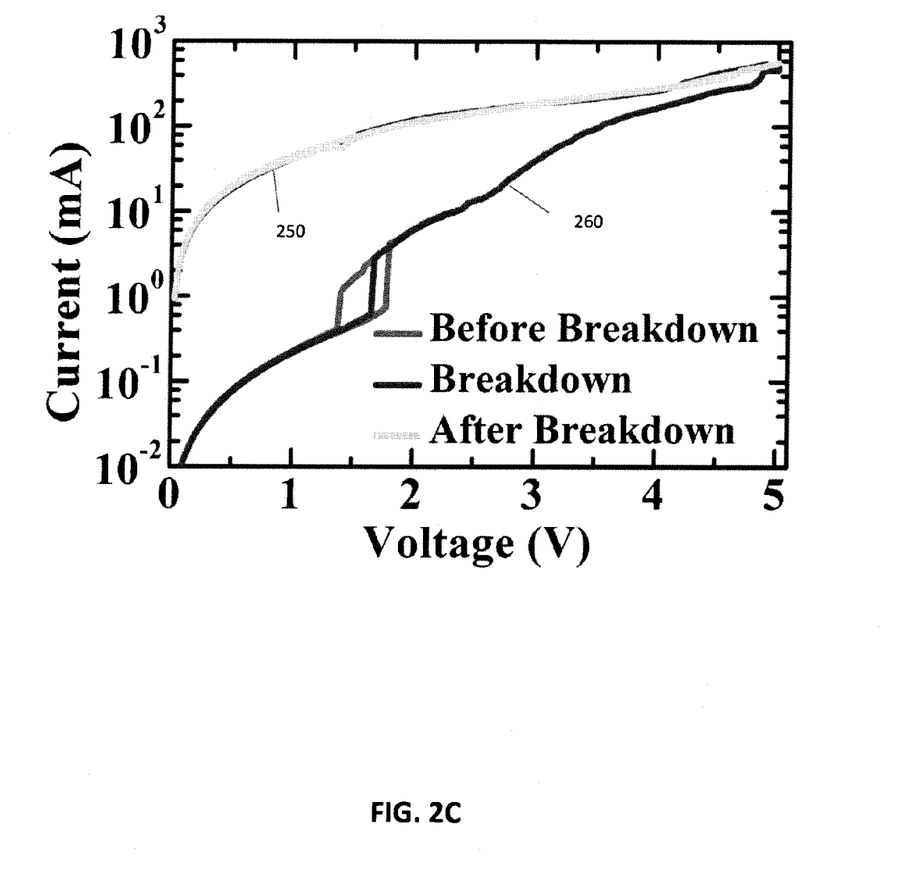
FIG. 2C shows the electrical breakdown of a reference sample that has a single $VO_2$ layer.

FIG. 2B shows the average and standard deviation of the threshold voltage Vth. The IV curve from a reference sample, grown at the same time as the bottom $VO_2$ layer in the heterostructure, is shown in FIG. 2C (labeled 250 and 260), to test if two sharp transitions would happen in a single $VO_2$ layer. The curve with one hysteresis loop is only reproducible with small $V_{max}$ and the device breaks down irreversibly at about 5V.

The difference in threshold electric field between two layers may result from their distinct metal-insulator transition temperatures (Tc) enabled through geometric confinement (of the bottom layer). Due to stress from the upper $H_yO_2/VO_2$ layer, the critical threshold conditions for MIT in the bottom $VO_2$ layer become slightly different than the top layer as seen in resistance-temperature (R-T) measurements. While two layers are illustrated, the invention can be extended to additional layers by, for example, thin film growth.

Figure 3A:
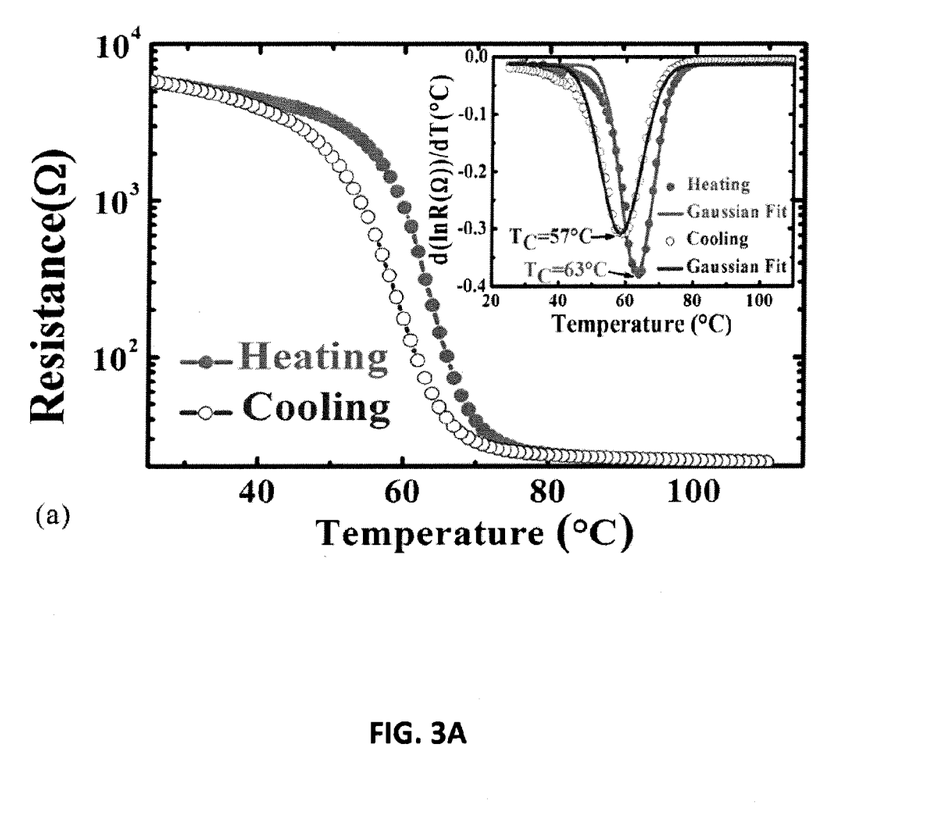
FIG. 3A illustrates a resistance-temperature plot measured with current in-plane.

FIG. 3A shows an R-T plot (solid dots for heating, empty dots for cooling) from the device measured with current in-plane. As higher valence vanadium oxide phase remains semiconducting (R decreases with rising T) in this temperature region and lower vanadium oxide valence phase goes through MIT at a much lower temperature, the flatness of R-T curve indicates good stoichiometry and quality of the top $VO_2$ layer.

The plot of: dlogR/dT, shown in the inset of FIG. 3A, shows one Gaussian peak in each branch and Tc (center of the peak) is 63° C. and 57° C. for heating and cooling respectively.

Figure 3B:
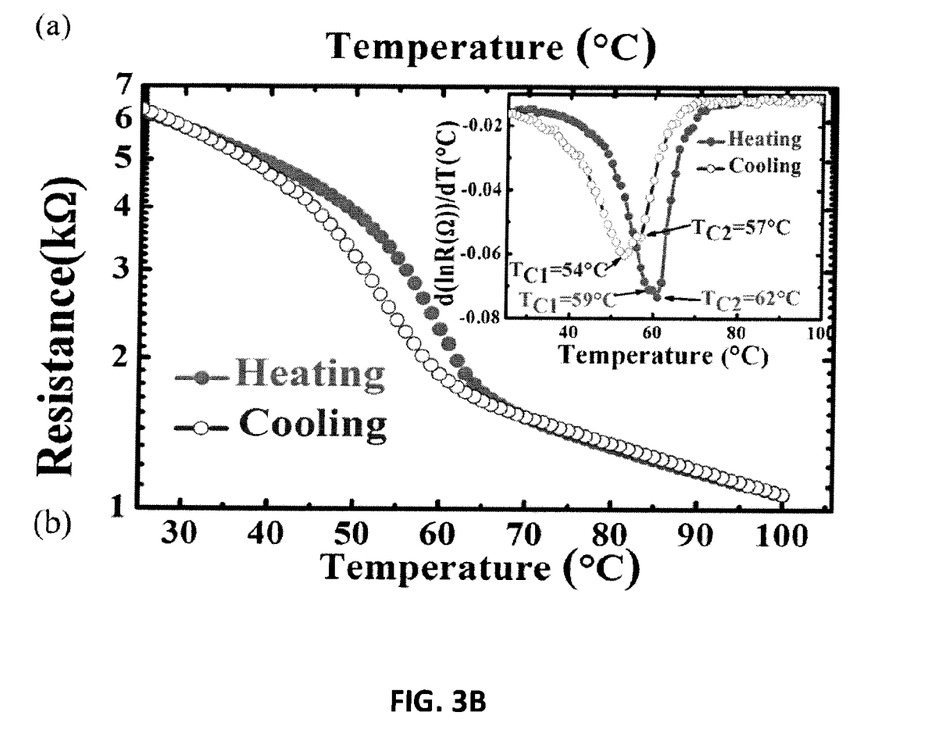
FIG. 3B illustrates a resistance-temperature plot measured with current out-of-plane.

FIG. 3B shows the R-T plot obtained from out-of-plane measurement. At temperatures above 70° C., the resistance is still decreasing exponentially with increasing temperature, which comes from $H_yO_2$'s resistance that has negative temperature dependence. The out-of-plane resistance of $H_yO_2$ is estimated to be on the order of a few kilo Ohms, which would minimize current passing through $H_yO_2$ in the in-plane measurements. The low of $H_yO_2$ resistance may be related to the roughness of bottom $VO_2$ layer (~few nm) leading to local enhanced current flow or defect-mediated conduction from oxygen deficiency.

FIG. 3B's inset shows dlogR/dT plots. Contrary to in-plane measurement, the out-of-plane results could not be fitted into one Gaussian peak. The total out-of-plane resistance equals the summation of the two $VO_2$ layers' and one $H_yO_2$ layer's resistance, dlogR/dT as a function of T is not the simple addition of two peaks (from two $VO_2$ layers) and a negative constant (from $H_yO_2$). It can still be seen from FIG. 3B that there are two peaks in one branch. The peak at a higher temperature originates from the top $VO_2$ layer, whereas the other peak represents the transition of bottom $VO_2$ layer. The smaller value of bottom $VO_2$ layer's T, is consistent with previous studies showing suppression of T, due to confinement effects.

In summary, in the present disclosure methods and systems are disclosed that relate to electrically induced multi-resistance states in functional oxide heterostructure devices that contain more than one functional oxide layer. The critical voltage for the transition in each layer can be tuned, for example by depositing a layer of stressor material on a layer so as to change the critical voltage at which the layer undergoes phase transition. In this way, variable resistance states are achieved in oxide heterostructures. In other words, multi-stage resistance switching may be achieved in heterostructure devices with materials that shows only one switching by itself. Since phase transitions can occur at multiple voltages, multiple bits can be stored by going through different voltages.

The methods and systems described in the present application are of relevance to areas that include, without limitation, memory and neural computation. These methods and systems allow a new class of memory chips and neural circuits to be built, based on functional oxides such as $VO_2$. Resistive random access memory is a major area of interest in the semiconductor industry. Key advantages provided by these methods and systems can include faster access time, smaller die size and lower power. Potential useful fields of application include the emerging field of phase change electronics.

The materials can be broadly related to "phase transition" or phase change materials, such as correlated insulators like several oxides and chalcogenides.

The components, steps, features, objects, benefits and advantages that are disclosed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

The methods and systems described in the present application can be extended to multiple heterostructure layers to create several resistance states.

What is claimed is:
1. A system comprising:
a layer of a first functional material deposited on a component of the system, wherein the first functional material undergoes a phase transition at a first critical voltage;
an insulating layer deposited upon the layer of first functional material; and
a layer of a second functional material deposited on the insulating layer, wherein the second functional material undergoes a phase transition at a second critical voltage;

wherein the insulating layer is configured to induce a stress on the layer of the first functional material so as to change the first critical voltage, so that the resistance of the system is tunable so as to allow the system to undergo multi-stage electrical switching of resistive states.

2. The system of claim 1, wherein the component comprises one of: an electrode, and an interfacial layer.

3. The system of claim 1, wherein the first functional material and the second functional material are identical.

4. The system of claim 1, wherein the first functional material is different from the second functional material.

5. The system of claim 1, wherein the first critical voltage and the second critical voltage are the same.

6. The system of claim 1, wherein the first and second functional materials comprise at least one of: an oxide; a nitride; a rare earth nickelide; and a chalcogenide.

7. The system of claim 6, wherein the oxide comprises one of: a functional oxide;
a metal oxide; and a semiconductor oxide.

8. The system of claim 7, wherein the metal oxide comprises one of a chromium oxide and a hafnium oxide; and wherein the semiconductor oxide comprises a silicon oxide.

9. The system of claim 6, wherein the rare earth nickelide comprises a samarium nickelide ($S_mN_iO_3$).

10. The system of claim 1, wherein the first functional material and the second functional material is $VO_2$, and the insulating layer is $H_fO_2$.

11. A tunable multi-resistance device, comprising:
a plurality N of structures stacked adjacent to one other, each structure comprising:
a functional layer deposited on a component of the device, the functional layer comprising a functional material that is adapted to undergo a phase transition at a threshold voltage; and
an insulating layer deposited on the functional layer;
wherein in each structure, the insulating layer is configured to induce a stress on the functional layer so as to change the threshold voltage at which the functional layer undergoes the phase transition, so that the device can undergo multi-stage electrical switching of resistive states.

12. The tunable multi-resistance device of claim 11, wherein the functional material comprises at least one of: an oxide; a nitride;
a rare earth nickelide; and a chalcogenide.

13. The tunable multi-resistance device of claim 11, wherein the component comprises one of: an electrode, and an interfacial layer.

14. A method comprising:
depositing a layer of a first functional material on a component of a system, the first functional material adapted to undergo a phase transition at a first critical voltage;
depositing an insulating layer upon the layer of the first functional material;
depositing a layer of a second functional material on the insulating layer, the second functional material adapted to undergo a phase transition at a second critical voltage; and
the insulating layer inducing a stress on the layer of the first functional material, so as to change the first critical voltage and thereby induce in the system multi-resistive states in which electrically driven phase transitions occur at multiple critical voltages.

15. The method of claim 14, wherein the component is a substrate.

* * * * *

UNITED STATES PATENT AND TRADEMARK OFFICE
CERTIFICATE OF CORRECTION

| | |
|---|---|
| PATENT NO. | : 9,343,206 B2 |
| APPLICATION NO. | : 14/373908 |
| DATED | : May 17, 2016 |
| INVENTOR(S) | : You Zhou et al. |

It is certified that error appears in the above-identified patent and that said Letters Patent is hereby corrected as shown below:

IN THE SPECIFICATION

Please insert the following government support clause, just before the BACKGROUND section (starting at Col. 1, line 18) and just after the CROSS-REFERENCE TO RELATED APPLICATIONS section (starting at Col. 1, line 5):

--STATEMENT REGARDING FEDERALLY SPONSORED RESEARCH
This invention was made with government support under grant number N00014-10-1-0131 from the United States Department of Defense (DOD) / Office of Naval Research (ONR). The government has certain rights in the invention.--

Signed and Sealed this
Ninth Day of August, 2016

Michelle K. Lee
*Director of the United States Patent and Trademark Office*